United States Patent
Li

(10) Patent No.: US 9,733,514 B2
(45) Date of Patent: Aug. 15, 2017

(54) LIGHT EMITTING DIODE LIGHT SOURCE, MANUFACTURING METHOD THEREOF, BACKLIGHT SOURCE AND DISPLAY DEVICE

(71) Applicants: BOE TECHNOLOGY GROUP CO., LTD., Beijing (CN); BEIJING BOE CHATANI ELECTRONICS CO., LTD., Beijing (CN)

(72) Inventor: Qiang Li, Beijing (CN)

(73) Assignees: BOE TECHNOLOGY GROUP CO., LTD., Beijing (CN); BEIJING BOE CHATANI ELECTRONICS CO., LTD., Beijing (CN)

(*) Notice: Subject to any disclaimer, the term of this patent is extended or adjusted under 35 U.S.C. 154(b) by 69 days.

(21) Appl. No.: 14/315,513

(22) Filed: Jun. 26, 2014

(65) Prior Publication Data
US 2015/0253622 A1    Sep. 10, 2015

(30) Foreign Application Priority Data
Mar. 6, 2014 (CN) .......................... 2014 1 0080931

(51) Int. Cl.
G02F 1/1335    (2006.01)
H01L 33/58    (2010.01)
H01L 33/60    (2010.01)

(52) U.S. Cl.
CPC ........ *G02F 1/133603* (2013.01); *H01L 33/58* (2013.01); *G02F 1/133608* (2013.01);
(Continued)

(58) Field of Classification Search
CPC ......... G02F 1/133603; G02F 1/133608; H01L 33/58; H01L 2224/73265;
(Continued)

(56) References Cited

U.S. PATENT DOCUMENTS

| 8,835,958 B2* | 9/2014 | Hsieh | H01L 33/58 257/100 |
| 2007/0001182 A1* | 1/2007 | Schardt | C09K 11/02 257/98 |

(Continued)

FOREIGN PATENT DOCUMENTS

| CN | 1577903 A | 2/2005 |
| CN | 1690811 A | 11/2005 |

(Continued)

OTHER PUBLICATIONS

First Office Action of CN Application No. 201410080931.7 issued Jul. 10, 2015, and its English Translation.

*Primary Examiner* — Steven Loke
*Assistant Examiner* — Juanita Rhodes
(74) *Attorney, Agent, or Firm* — Nath, Goldberg & Meyer; Joshua B. Goldberg; Stanley N. Protigal

(57) ABSTRACT

The present invention provides a LED light source for increasing a light emitting angle and a manufacturing method thereof, as well as a backlight source and a display device. A LED light source comprises a circuit board, a LED which is directly fixed on and electrically connected to the circuit board, and a packaging piece for packaging a LED light emitting chip. A prism film with a prism microstructure may be arranged between the packaging piece and the LED.

12 Claims, 3 Drawing Sheets

(52) U.S. Cl.
CPC .... *H01L 33/60* (2013.01); *H01L 2224/45144* (2013.01); *H01L 2224/48091* (2013.01); *H01L 2224/73265* (2013.01); *H01L 2933/0091* (2013.01)

(58) Field of Classification Search
CPC ... H01L 2224/48091; H01L 2933/0091; H01L 33/60
See application file for complete search history.

(56) References Cited

U.S. PATENT DOCUMENTS

| | | | | |
|---|---|---|---|---|
| 2007/0120135 A1* | 5/2007 | Soules | ................ | H01L 33/507 257/98 |
| 2007/0196939 A1* | 8/2007 | Park | ................ | H01L 33/54 438/22 |
| 2008/0117500 A1* | 5/2008 | Narendran | ............ | H01L 33/507 359/326 |
| 2009/0315051 A1* | 12/2009 | Wu | ................ | H01L 33/508 257/98 |
| 2010/0123386 A1* | 5/2010 | Chen | ................ | H01L 33/58 313/502 |
| 2010/0308354 A1* | 12/2010 | David | ............ | H01L 33/507 257/98 |
| 2011/0228514 A1* | 9/2011 | Tong | ................ | H01L 25/0753 362/84 |
| 2013/0128571 A1* | 5/2013 | Yamazaki | ............ | G02B 5/0221 362/235 |
| 2013/0161672 A1* | 6/2013 | Hsieh | ................ | H01L 33/58 257/98 |

FOREIGN PATENT DOCUMENTS

| | | | | |
|---|---|---|---|---|
| CN | 103187504 A | | 7/2013 | |
| CN | 103378276 A | * | 10/2013 | |
| CN | 103594463 A | | 2/2014 | |
| WO | 2007121486 A2 | | 10/2007 | |
| WO | WO 2007121486 A2 | * | 10/2007 | ......... G02B 27/0955 |

* cited by examiner

LIGHT EMITTING DIODE LIGHT SOURCE, MANUFACTURING METHOD THEREOF, BACKLIGHT SOURCE AND DISPLAY DEVICE

FIELD OF THE INVENTION

The present invention relates to the field of display technology, and particularly relates to a light emitting diode light source and a manufacturing method thereof, as well as a backlight source and a display device.

BACKGROUND OF THE INVENTION

Along with the development in display industry, cost reduction and energy saving have attracted more and more attention. By reducing the number of LEDs (light emitting diode) used by a backlight source, the cost can be effectively reduced and the energy-saving effect can be achieved.

In a liquid crystal display device, as shown in FIG. 1, a LED light source comprises a circuit board 10; a support 11 arranged on the circuit board 10; a LED light emitting chip 13 fixed inside the support 11 through a thermal conductive adhesive 12; and a packaging piece 15 for packaging the LED light emitting chip 13. Anode and cathode of the LED light emitting chip 13 are connected to the circuit board 10 through conductive gold wires 14, thereby realizing the control of the LED light source. Due to the limitation of an opening angle of the support, the light emitting angle of a traditional LED light source is less than or equal to 120°, and it is difficult to obtain light with a uniform wide angle.

SUMMARY OF THE INVENTION

In order to solve the problem that the light emitting angle of conventional LED light source is small, embodiments of the present invention provide a LED light source and a manufacturing method thereof, as well as a backlight source and a display device.

An embodiment of the present invention provides a LED light source, comprising a circuit board; a LED light emitting chip configured to be directly fixed on and electrically connected to the circuit board; and a packaging piece configured to package the LED light emitting chip.

Optionally, the LED light source further comprises a prism micro-structure, which is arranged above the LED light emitting chip.

Optionally, a prism film, which is provided with the prism micro-structure, is arranged between the LED light emitting chip and the packaging piece.

Optionally, the prism micro-structure is arranged on a side of the packaging piece close to the LED light emitting chip.

Optionally, a light outgoing surface of the packaging piece is arc-shaped or square, and a position of the LED light emitting chip corresponds to a center position of the packaging piece.

Optionally, the prism micro-structure is only arranged right above the LED light emitting chip to cause light right above the LED light emitting chip to deflect to a peripheral region.

Optionally, density of the prism micro-structure changes gradually.

Optionally, the packaging piece may contain phosphor.

Optionally, a surface of the circuit board, on which the LED light emitting chip is fixed, is covered with a reflecting layer.

An embodiment of the present invention provides a manufacturing method of a LED light source, comprising steps of:
- directly fixing a LED light emitting chip on a circuit board;
- electrically connecting the LED light emitting chip to the circuit board; and
- forming a packaging piece to package the LED light emitting chip.

Optionally, before the step of forming the packaging piece to package the LED light emitting chip, the method further comprises a step of:
- arranging a prism micro-structure above the LED light emitting chip.

Optionally, the step of arranging the prism micro-structure above the LED light emitting chip specifically comprises steps of:
- forming the packaging piece; and
- attaching a prism film provided with the prism micro-structure onto a side of the packaging piece close to the LED light emitting chip.

Optionally, the step of arranging the prism micro-structure above the LED light emitting chip specifically comprises:
- arranging the prism micro-structure on the side of the packaging piece close to the LED light emitting chip.

Optionally, before the step of forming the packaging piece to package the LED light emitting chip, the method further comprises a step of:
- arranging a reflecting layer on a surface of the circuit board, on which the LED light emitting chip is fixed.

An embodiment of the present invention provides a backlight source, comprising the LED light source according to any one provided by the embodiments of the present invention.

An embodiment of the present invention provides a display device, comprising a backlight source provided by the embodiments of the present invention.

Embodiments of the present invention provides a LED light source and a manufacturing method thereof, as well as a backlight source and a display device, in which the LED light emitting chip is directly fixed to the circuit board and further packaged through the packaging piece without arranging a support, and therefore, light emitted from the LED light emitting chip has a wider light emitting angle.

BRIEF DESCRIPTION OF THE DRAWINGS

In order to illustrate the technical solutions in the embodiments of the present invention or in the prior art more clearly, the accompanying drawings required to be used in the description of the embodiments or the prior art are simply introduced as follows. Apparently, the accompanying drawings in the description only illustrate some embodiments of the present invention. But for those skilled in the art, other drawings can be obtained based on the accompanying drawings without creative efforts.

REFERENCE NUMERALS

10: circuit board; 11: support; 12: thermal conductive adhesive; 13: LED light emitting chip; 14: conductive gold wire; 15: packaging piece; and 16: prism film.

DETAILED DESCRIPTION OF THE EMBODIMENTS

Figure 1:
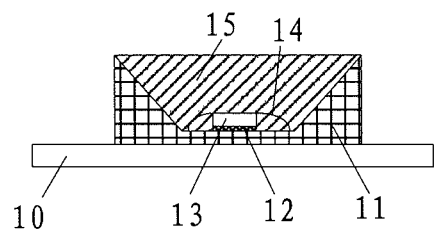
FIG. 1 is a schematic diagram of an conventional LED light source.
Figure 2:
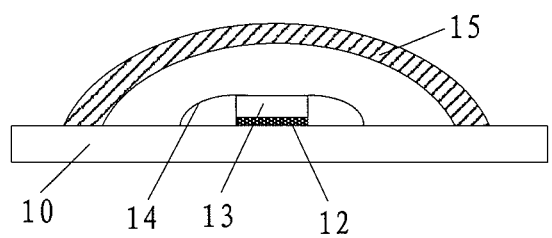
FIG. 2 is a schematic diagram of a LED light source according to an embodiment of the present invention.

The technical solutions in the embodiments of the present invention will be described clearly and completely in conjunction with the accompanying drawings. Obviously, the drawings illustrate only various embodiments of the invention and are therefore not to be considered limiting of the invention's scope as it may include other effective embodiments which are obtained by those skilled in the art without creative efforts. t As shown in FIG. 2, a LED light source according to an embodiment of the present invention comprises a circuit board 10; a LED light emitting chip 13, which is adhered onto the circuit board 10 through a thermal conductive adhesive 12 and thus electrically connected to the circuit board; and a packaging piece 15, which is used for packaging the LED light emitting chip 13. It should be noted that, the thermal conductive adhesive may be used here to realize better heat dissipation for the LED light emitting chip, but it is only an example of present invention and it is not limited to this method, other methods may also be used for fixing.

Therefore, compared with a conventional LED light source, in the LED light source according to the embodiment of the present invention, the LED light emitting chip 13 may be directly fixed on the circuit board 10 since the support is not exist, therefore the light emitting angle of the LED light emitting chip 13 may lager than 160° and up to 180°.

Optionally, the LED light source according to another embodiment of the present invention may further comprise a prism micro-structure. The prism micro-structure may be arranged above the LED light emitting chip 13 to further increase the light emitting angle, and to solve the problems of non-uniform brightness and the like.

It should be noted that, the prism micro-structure above the LED light emitting chip 13 may be arranged between the LED light emitting chip 13 and the packaging piece 15 or be arranged above the packaging piece 15 (the light outgoing side of the packaging piece 15 far away from the LED light emitting chip 13). The prism micro-structure may set to, as required, the form of serration, Fresnel lens or the like.

Figure 3:
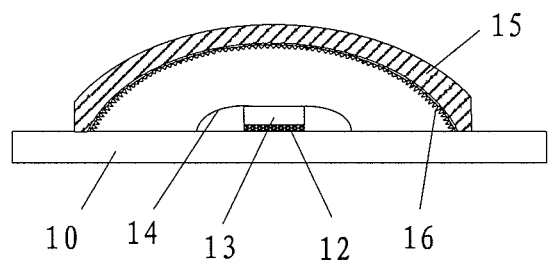
FIG. 3 is a schematic diagram of another LED light source according to an embodiment of the present invention.

Optionally, the above-mentioned prism micro-structure may be realized through a prism film. As shown in FIG. 3, the prism film 16 with the prism micro-structure may be arranged between the LED light emitting chip 13 and the packaging piece 15. As the prism film 16 is arranged on the side of the packaging piece 15 close to the LED light emitting chip 13, the problems that the prism micro-structure falls off due to insecure installation of the prism film may be avoided, and the volume of the LED is reduced. In addition, generally, the packaging piece 15 preferably contain phosphor, so that the accuracy of chromaticity may be improved by arranging the packaging piece 15 above the prism micro-structure, thus solving the problem of non-uniform light emitting. Of course, in addition, the prism film 16 may also be arranged on the light outgoing surface of the packaging piece 15 far away from the LED light emitting chip 13.

Figure 4:
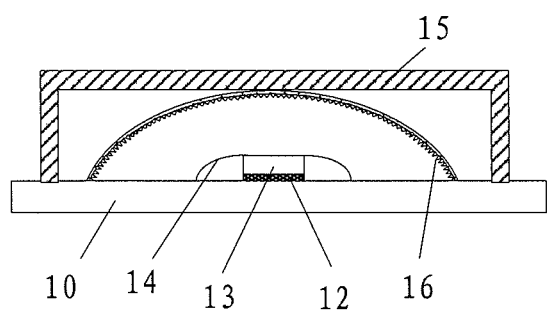
FIG. 4 is a schematic diagram of still another LED light source according to an embodiment of the present invention.

Optionally, as shown in FIGS. 2 to 4, the light outgoing surface of the packaging piece 15 may be arc-shaped as shown in FIGS. 2 and 3 and may be square as shown in FIG. 4, and the position of the LED light emitting chip 13 corresponds to the center position of the packaging piece 15. A device designed to have a rectangular structure according to the embodiment of the present invention has a similar structure as a conventional LED with a rectangular structure in the prior art, so that the design of other accessories in the prior art may be used continuously and the cost is thus saved; however, the distance from the light emitting chip to the light outgoing surface may be equivalent or similar by using the arc-shaped packaging piece, that is, the propagation distance is equivalent or similar, which allows emitted light to be more uniform.

Figure 5:
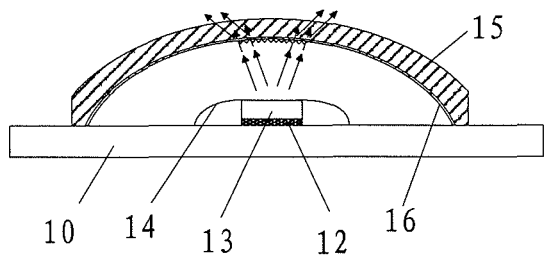
FIG. 5 is a schematic diagram of still another LED light source according to an embodiment of the present invention.

Optionally, the prism micro-structure may be only arranged right above the LED light emitting chip to enable the light right above the LED light emitting chip to deflect to a peripheral region. Specifically, as shown in FIG. 5, in the prism film 16, only a part of the prism film right above the LED light emitting chip 13 has the prism micro-structure, as such, light in a region exactly opposite to the LED light emitting chip 13 may be deflected to the peripheral region through the prism micro-structure, the light emitting brightness of the region exactly opposite to the LED light emitting chip 13 may be reduced, and the brightness of the region other than the region exactly opposite to the LED light emitting chip 13 is enhanced, so as to fit working environment. Optical design may also be performed as needed, light outgoing feature may be changed by designing the density of the prism micro-structure. For example, the structure may be designed as the density of the prism micro-structure which is arranged at the central part of the arc surface is denser than the density of the prism micro-structure which is arranged at the peripheral region so as to the light in the central region may be refracted to the peripheral region and uniform light emitting is thus realized; and more preferably, the density of the prism micro-structure changes gradually, which causes regulation degree of light to change gradually, and thus more uniform light emitting is realized.

Optionally, the surface of the circuit board, on which the LED light emitting chip is fixed, is covered with a reflecting layer, thereby increasing the utilization rate of light. The light emitting angle and intensity may be further adjusted by refraction of the prism micro-structure and reflection of the reflecting layer.

A backlight source according to an embodiment of the present invention comprises the LED light source in any one of the embodiments of the present invention. The backlight source may be a direct type backlight source or a side type backlight source. Compared with a LED in the direct type backlight source, a LED light source in the side type backlight source needs a larger light emitting angle. Therefore, the LED light sources in the backlight sources need to be set into different patterns according to the requirements of the different backlight sources. For example, a LED light source applied to the direct type backlight source may be the LED light source as shown in FIG. 2 and FIG. 3, and a LED light source applied to the side type backlight source may be the LED light source as shown in FIG. 4.

A display device according to an embodiment of the present invention comprises the backlight source according to the embodiment of the present invention. The display device, such as a television, a digital camera, a mobile phone, a tablet personal computer or the like, may be any product or component with display function comprising a display device such as a liquid crystal display or the like.

Figure 6:
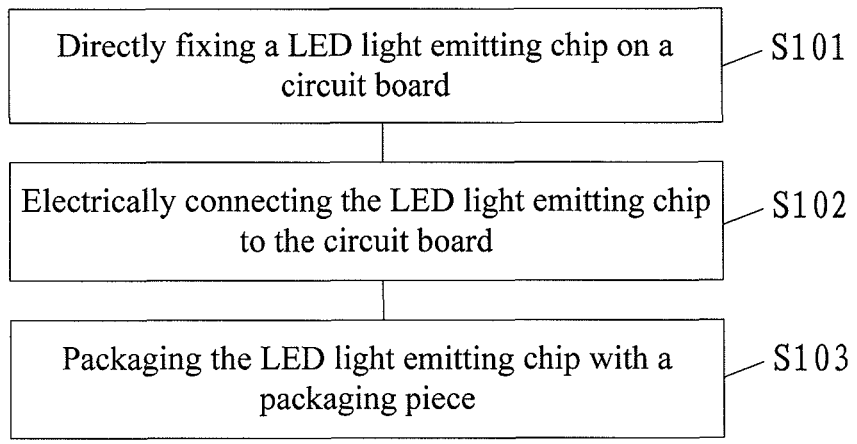
FIG. 6 is a flow chart of a manufacturing method of a LED light source according to an embodiment of the present invention.

An embodiment of the present invention provides a manufacturing method of a LED light source, as shown in FIG. 6, comprising the Steps 101 to 103.

Step 101, a LED light emitting chip is directly fixed onto a circuit board.

Specifically, the LED light emitting chip may be adhered to the circuit board for fixing through thermal conductive adhesive such as a high-viscosity thermal conductive adhesive and the like, and better heat dissipation of the LED light emitting chip may be realized by employing the thermal conductive adhesive. The specific process may be as follows: coating the thermal conductive adhesive in a corresponding position on the circuit board; placing the LED light emitting chip in the position where the adhesive is coated; and fix the adhesion by infrared high-temperature treatment under a drying condition. The fixing method described in Step 101 is only used as an example, the present invention is not limited thereto, and the LED light emitting chip may also be directly fixed onto the circuit board by using other methods.

Step 102, the LED light emitting chip is electrically connected to the circuit board.

Specifically, the LED light emitting chip may be electrically connected to the circuit board by employing a conductive gold wire which has small resistance and high electron mobility.

Step 103, a packaging piece is formed to package the LED light emitting chip.

Herein, the packaging piece may be formed by phosphor contained resin. The chromaticity and the stable light emitting chromaticity may be further adjusted by employing phosphor, so as to achieve more precise light emitting chromaticity.

It should be noted that, in Step 103, the packaging piece may be formed before the packaging process, and then the LED chip may be packaged by the packaging piece; or the packaging piece may be directly formed on the circuit board and the LED light emitting chip may be packaged simultaneously.

Optionally, the method further comprises the following step before Step 103.

Step 104, a prism micro-structure is arranged above the LED light emitting chip. Specifically, the prism micro-structure is arranged on a side of the packaging piece, which is formed by using a mold or the like, close to the LED light emitting chip.

Figure 7:
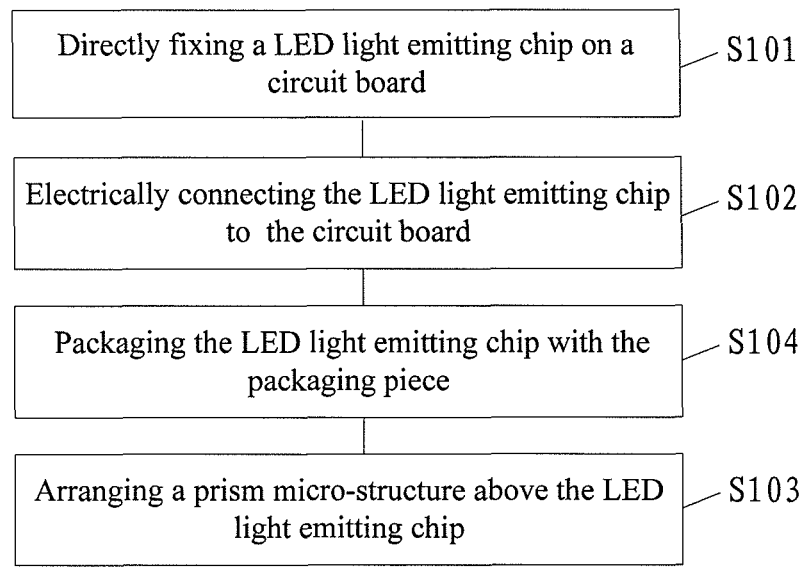
FIG. 7 is a flow chart of another manufacturing method of a LED light source according to an embodiment of the present invention.

It should be noted that, Step 104 is not limited to be implemented before Step 103 and may be implemented before Step 102 or Step 101. Step 104 is between Steps 102 and 103 as shown in FIG. 7 is only an example, and the present invention is not limited to this.

Figure 8:
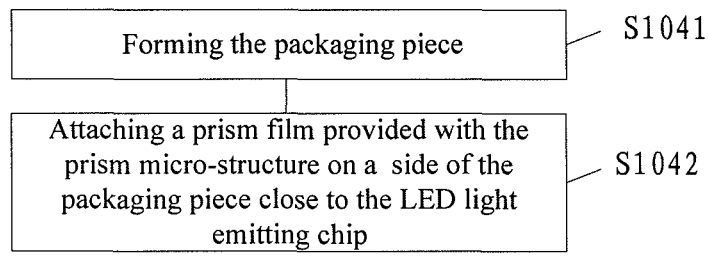
FIG. 8 is a flow diagram of a method for forming a prism micro-structure above a LED light emitting chip according to an embodiment of the present invention.

Optionally, as shown in FIG. 8, Step 104 specifically comprises the steps 1041 and 1042.

Step 1041, the packaging piece is formed.

For example, the packaging piece may be formed through as mold.

Step 1042, a prism film provided with the prism micro-structure is attached to the side of the packaging piece close to the LED light emitting chip.

Specifically, as shown in FIG. 3, the prism film 16 with the prism micro-structure may be adhered to the side of the packaging piece 15 close to the LED light emitting chip 13 through the thermal conductive adhesive, and then infrared high-temperature treatment is performed under a dry condition for curing. Thus, the prism micro-structure is arranged above the LED light emitting chip 13.

Here, it should be noted that, the optional Steps 1041 and 1042 are only applied to the situation that the packaging piece is formed before the packaging process, and then the LED chip is packaged by the packaging piece, as described in Step 103.

Optionally, before packaging the LED light emitting chip by the packaging piece, the method further comprises:

arranging a reflecting layer on the surface of the circuit board, on which the LED light emitting chip is fixed.

The above description is only specific embodiments of the present invention, and the protection scope of the present invention is not limited thereto. Changes or substitutions that may be easily made by the person skilled in the art in the technical scope disclosed by the present invention should be considered to be within the protection scope of the present invention. Therefore, the protection scope of the present invention should be subject to the protection scope defined by the claims.

The invention claimed is:

1. A light emitting diode light source, comprising:
a circuit board;
a light emitting diode chip configured to be directly fixed on and electrically connected to the circuit board and
a packaging piece configured to package the light emitting diode chip,
wherein the light emitting diode light source further comprises a prism micro-structure, which is arranged above the light emitting diode chip,
wherein a prism film containing the prism micro-structure is arranged between the light emitting diode chip and the packaging piece, for deflecting light emitted from the light emitting diode chip,
wherein the prism film is arc-shaped, and wherein
the prism micro-structure is only positioned right above the light emitting diode chip for deflecting light emitted from the light emitting diode chip to a peripheral region.

2. The light emitting diode light source according to claim 1, wherein the prism micro-structure is arranged on a side of the packaging piece close to the light emitting diode chip.

3. The light emitting diode light source according to claim 1, wherein a density of the prism micro-structure changes gradually.

4. The light emitting diode light source according to claim 1, wherein a light outgoing surface of the packaging piece is arc-shaped, and a position of the light emitting diode chip corresponds to a center position of the packaging piece.

5. The light emitting diode light source according to claim 2, wherein a light outgoing surface of the packaging piece is arc-shaped or square, and a position of the light emitting diode chip corresponds to a center position of the packaging piece.

6. The light emitting diode light source according to claim 1, wherein the packaging piece contains phosphor.

7. The light emitting diode light source according to claim 1, wherein a surface of the circuit board, on which the light emitting diode chip is fixed, is covered with a reflecting layer.

8. A manufacturing method of a light emitting diode light source, comprising:
- directly fixing a light emitting diode chip onto a circuit board;
- electrically connecting the light emitting diode chip to the circuit board; and
- forming a packaging piece to package the light emitting diode chip,
- wherein before the step of forming the packaging piece to package the light emitting diode chip, the manufacturing method further comprises a step of arranging a prism micro-structure above the light emitting diode chip,
- wherein the step of arranging the prism micro-structure above the light emitting diode chip comprises the steps of:
  - forming the packaging piece; and
  - attaching a prism film provided with the prism micro-structure to a side of the packaging piece close to the light emitting diode chip, for deflecting light emitted from the light emitting diode chip,
- wherein the prism film is arc-shaped, and wherein
- the prism micro-structure is only positioned right above the light emitting diode chip for deflecting light emitted from the light emitting diode chip to a peripheral region.

9. The manufacturing method according to claim 8, wherein the step of arranging the prism micro-structure above the light emitting diode chip comprises a step of:
- arranging the prism micro-structure on a side of the packaging piece close to the light emitting diode chip.

10. The manufacturing method according to claim 8, wherein before the step of forming the packaging piece to package the light emitting diode chip, the method further comprises a step of:
- arranging a reflecting layer on a surface of the circuit board, on which the light emitting diode chip is fixed.

11. A backlight source, comprising the light emitting diode light source according to claim 1.

12. A display device, comprising the backlight source according to claim 11.

* * * * *